(12) United States Patent
Tischler et al.

(10) Patent No.: US 7,649,196 B2
(45) Date of Patent: Jan. 19, 2010

(54) LIGHT EMITTING DEVICE

(75) Inventors: Jonathan Tischler, Sharon, MA (US);
Michael Scott Bradley, Cambridge, MA (US); Vladimir Bulovic, Lexington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 348 days.

(21) Appl. No.: 11/265,199

(22) Filed: Nov. 3, 2005

(65) Prior Publication Data

US 2009/0072751 A1 Mar. 19, 2009

Related U.S. Application Data

(60) Provisional application No. 60/624,187, filed on Nov. 3, 2004.

(51) Int. Cl.
*H01S 5/36* (2006.01)

(52) U.S. Cl. .................. 257/40; 257/E51.018; 372/39

(58) Field of Classification Search .............. 257/40, 257/E51.018, E51.021, E51.026–E51.036, 257/E51.052; 372/39, 43.01, 44.011, 81, 372/92
See application file for complete search history.

(56) References Cited

U.S. PATENT DOCUMENTS

| | | | |
|---|---|---|---|
| 5,260,957 A | 11/1993 | Hakimi et al. | |
| 5,293,050 A | 3/1994 | Chapple-Sokol et al. | |
| 5,354,707 A | 10/1994 | Chapple-Sokol et al. | |
| 5,422,489 A | 6/1995 | Bhargava | |
| 5,505,928 A | 4/1996 | Alivisatos et al. | |
| 5,512,131 A | 4/1996 | Kumar et al. | |
| 5,525,377 A | 6/1996 | Gallagher et al. | |
| 5,537,000 A | 7/1996 | Alivisatos et al. | |
| 5,585,640 A | 12/1996 | Huston et al. | |
| 5,613,140 A | 3/1997 | Taira | |
| 5,677,545 A | 10/1997 | Shi et al. | |
| 5,751,018 A | 5/1998 | Alivisatos et al. | |
| 5,780,174 A * | 7/1998 | Tokito et al. ............... 428/690 |
| 5,895,717 A * | 4/1999 | Cao et al. ............... 428/411.1 |
| 5,958,573 A | 9/1999 | Spitler et al. | |
| 6,103,868 A | 8/2000 | Heath et al. | |
| 6,157,047 A | 12/2000 | Fujita et al. | |
| 6,160,828 A * | 12/2000 | Kozlov et al. ............... 372/39 |
| 6,180,239 B1 | 1/2001 | Whitesides et al. | |
| 6,207,229 B1 | 3/2001 | Bawendi et al. | |
| 6,236,060 B1 | 5/2001 | Chan et al. | |

(Continued)

FOREIGN PATENT DOCUMENTS

WO WO 96/10282 4/1996

(Continued)

OTHER PUBLICATIONS

Takada, N., et al. "Polariton Emission from Polysilane-Based Organic Microcavities." Appl. Phys. Lett., vol. 82, No. 12 (Mar. 24, 2003): pp. 1821-1814.*

(Continued)

*Primary Examiner*—Douglas M Menz
*Assistant Examiner*—Matthew W Such
(74) *Attorney, Agent, or Firm*—Steptoe & Johnson LLP (57) ABSTRACT

A light emitting device includes an optical cavity in resonance with an optical transition of a material disposed in the cavity. The device can form an exciton-polariton state.

9 Claims, 6 Drawing Sheets

U.S. PATENT DOCUMENTS

| | | | |
|---|---|---|---|
| 6,251,303 | B1 | 6/2001 | Bawendi et al. |
| 6,294,401 | B1 | 9/2001 | Jacobson et al. |
| 6,322,901 | B1 | 11/2001 | Bawendi et al. |
| 6,379,635 | B2 | 4/2002 | O'Brien et al. |
| 6,447,698 | B1 | 9/2002 | Ihara et al. |
| 6,501,091 | B1 | 12/2002 | Bawendi et al. |
| 6,518,168 | B1 | 2/2003 | Clem et al. |
| 6,576,291 | B2 | 6/2003 | Bawendi et al. |
| 6,607,829 | B1 | 8/2003 | Bawendi et al. |
| 6,797,412 | B1 | 9/2004 | Jain et al. |
| 6,803,719 | B1 | 10/2004 | Miller et al. |
| 6,846,565 | B2 | 1/2005 | Korgel et al. |
| 6,864,626 | B1 | 3/2005 | Weiss et al. |
| 2001/0005495 | A1 | 6/2001 | O'Brien et al. |
| 2003/0017264 | A1 | 1/2003 | Treadway et al. |
| 2003/0042850 | A1 | 3/2003 | Bertram et al. |
| 2003/0209972 | A1* | 11/2003 | Holmes et al. ............... 313/504 |
| 2004/0023010 | A1 | 2/2004 | Bulovic et al. |
| 2004/0265622 | A1 | 12/2004 | Sadasivan et al. |
| 2005/0047458 | A1* | 3/2005 | Nomura et al. ............... 372/39 |
| 2005/0258418 | A1 | 11/2005 | Steckel et al. |
| 2006/0159901 | A1 | 7/2006 | Tischler et al. |
| 2006/0196375 | A1 | 9/2006 | Coe-Sullivan et al. |

FOREIGN PATENT DOCUMENTS

| | | |
|---|---|---|
| WO | WO 97/10175 | 3/1997 |
| WO | WO 99/26299 | 5/1999 |
| WO | WO 2005004253 | 1/2005 |
| WO | WO 2005017951 | 2/2005 |

OTHER PUBLICATIONS

Lidzey, D.G., et al. "Photon-Mediated Hybridization of Frenkel Excitons in Organic Semiconductor Microcavities." Science, vol. 288 (Jun. 2, 2000): pp. 1620-1623.*

Schouwink, P., et al. "Observation of Stron Exciton-Photon Coupling in an Organic Microcavity." Chem. Phys. Lett., vol. 344 (Aug. 24, 2001): 352-356.*

Lidzey, D.G., et al. "Strong Exciton-Photon Coupling in an Organic Semiconductor Microcavity." Nature, vol. 395 (Sep. 3, 1998): pp. 53-55.*

Hobson, P.A., et al. "Strong Exciton-Photon Coupling in a Low-Q All-Metal Mirror Microcavity." Appl. Phys. Lett., vol. 81, No. 19 (Nov. 4, 2002): pp. 3519-3521.*

Vuckovic, J., et al. "Surface Plasmon Enhanced LED." IEEE Technical Digest: Quantum Electronics and Laser Science (QELS) Conference (May 7-12, 2000): pp. 41-42.*

Holmes, R.J. and Forrest, S.R. "Strong Exciton-Photon Coupling and Exciton Hybridization in a Thermally Evaporated Polycrystalline Film of an Organic Small Molecule." Phys. Rev. Lett., vol. 93, No. 18 (Oct. 29, 2004): Article 186404.*

Oulton, R.F., et al. "Stong Coupling in Organic Semiconductor Microcavities." Semicond. Sci. Technol., vol. 18 92003): pp. S419-S427.*

Litinskaya, M., et al. "Exciton-Polaritons in a Crystalline Anisotropic Organic Microcavity." Phys. Stat. Sol. A, vol. 201, No. 4 (2004): pp. 646-654.*

Connolly, L.G., et al. "Strong Coupling in High-Finesse Organic Semiconductor Microcavities." Appl. Phys. Lett., vol. 83, No. 26 (Dec. 29, 2003): pp. 5377-5379.*

Klimovitch, G.V. "Direct Creation of Quantum Well Excitons and Microcavity Exciton Polaritons by Resonant Tunneling and Phonon Emission: Fundamentals Physics and Device Applicants." PhD Thesis. Stanford University. UMI Microform 9924448 (1999).*

Adachi et al., "High-efficiency red electrophosphorescence devices", Appl. Phys. Lett. 78, 1622 (2001).

Agranovich et al., "Cavity polaritons in microcavities containing disordered organic semiconductors," *Phys. Rev. B* 2003, 67, 085311.

Aktsipetrov et al. "Generation of reflected second harmonic at semiconductor quantum dots," JETP Letters, vol. 55, No. 8, 435-439 (1992).

Alivisatos, "Perspectives on the Physical Chemistry of Semiconductor Nanocrystals" J. Phys. Chem. 1996(100):13226-13239, 1996.

Baas et al., "Optical bistability in semiconductor microcavities," *Physical Review A* 2004, 69, 023809.

Baltramiejunas et al., "Rapid Processes of Darkening and Bleaching in CdS Doped Glasses," Superlattices and Microstructures vol. 10, No. 3, 307-310 (1990).

Baltrameyunas et al., "Fast switching of the transmission of light by glasses activated with CdS microcrystals," Sov. Phys. Semicond., vol. 25 No. 2, 164-166 (1991).

Berman, Advances in Atomic, Molecular, and Optical Physics, edited by B. Bederson (Academic Press, Inc., New York, 1994).

Bhargava et al., "Quantum Confined Atoms of Doped ZnO Nanocrystals", Phys. Stat. Sol (b) 229, No. 2, 897-901 (2002).

Bourbon et al., "Electroluminescence of Self-Assembled Films of Poly (p-phenylene vinylene) and J-Aggregates," Synthetic Metals 1999, 101, 152-153.

Bradley et al., "Layer-by-Layer J-Aggregate Thin Films with a Peak Absorption Constant of $10^6$ cm$^{-1}$," Advanced Materials 2005, 17, 1881-1886.

Bulović et al., "Molecular Organic Light-Emitting Devices", *Semiconductors and Semimetals* 2000, 64, 255 (2000).

Chamarro et al., "Enhancement of Exciton Exchange Interaction by Quantum Confinement in CdSe Nanocrystals," Jpn. J. Appl. Phys, vol. 34, 12-14 (1994).

Chamarro et al., "Size-dependent Electron-Hole Exchange Interaction in CdSe Quantum Dots, Il Nuovo Cimento," vol. 17, Nos. 11-12, (1995) 1407-1412.

Chamarro et al., "Enhancement of electron-hole exchange interaction in CdSe nanocrystals; A quantum confinement effect," Physical Review B, vol. 53, No. 3, Jan. 15, 1996-I, 1336-1342.

Chepic et al., "Auger ionization of semiconductor quantum drops in a glass matrix," Journal of Luminescence 47 (1990) 113-127 North-Holland.

Coe et al., "Electroluminescence from single monolayers of nanocrystals in molecular organic devices," *Nature* 2002, 420, 800-803.

Coe-Sullivan et al., "Large-Area Ordered Quantum-Dot Monolayers via Phase Separation During Spin-Casting", Advanced Functional Materials, 15, 1117-1124 (2005).

Colvin et al., "Light-emitting diodes made from cadmium selenide nanocrystals and a semiconducting polymer" Nature 370(6488):354-357, Aug. 4, 1994.

D'Andrade et al., "Bright White Electrophosphorescent Triple-Emissive Layer Organic Light Emitting Device", MRS Fall Meeting, BB6.2 (2001).

Dabbousi et al., "Electroluminescence from CdSe quantum-dot/polymer composites" Appl. Phys. Lett. 66(11):1316-1318, Mar. 13, 1995.

Dabbousi et al., "(CdSe)ZnS Core-Shell Quantum Dots: Synthesis and Characterization of a Size Series of Highly Luminescent Nanocrystallites", J. Phys. Chem. B. 101, 9463 (1997).

Danek et al., "Synthesis of Luminescent Thin-Film CdSe/ZnSe Quantum Dot Composites Using CdSe Quantum Dots Passivated with an Overlayer of ZnSe" Chem. Mater. 8(1):173-180, 1996.

Decher et al., "Buildup of ultrathin multilayer films by a self-assembly process: III. Consecutively alternating adsorption of anionic and cationic polyelectrolytes on charged surfaces," *Thin Solid Films* 1992, 210, 831-835.

Decher, "Fuzzy Nanoassemblies: Toward Layered Polymeric Multicomposites," *Science*, 1997, 277: 1232-1237.

Deng et al., "Condensation of Semiconductor Microcavity Exciton Polaritons," *Science* 2002, 298, 199-202.

Diehl, "Fraunhofer LUCOLEDs to replace lamps," III-Vs Rev. 10(1), 1997.

Dirr et al., "Organic Light Emitting Diodes with Reduced Spectral and Spacial Halfwidths", Jpn. J. Appl. Phys. 37, 1457 (1998).

Dneproviskii et al., "Time-Resolved Luminescence of CdSe Microcrystals," Solid State Communications, vol. 74, No. 7, pp. 555-557 (1990).

Edamatsu et al., "Subpicosecond dynamics of confined excitons and optical nonlinearities of CuCl quantum dots," Journal of Luminescence 66 & 67 (1996) 406-409.

Efros et al., "Resonance Raman Spectroscopy of Electron-Hole Pairs—Polar Phonon Coupling in Semiconductor Quantum Microcrystals," Solid State Communications, vol. 78, No. 10, 853-856 (1991).

Ekimov et al., "Quantum size effect in three-dimensional microscopic semiconductor crystals," JETP Lett, vol. 34, No. 6, Sep. 20, 1981, pp. 345-349.

Ekimov et al., "Quantum size effect in the optical spectra of semiconductor microcrystals," Sov. Phys. Semicond. 16(7), Jul. 1982, pp. 775-778.

Ekimov et al., "Size quantization of the electron energy spectrum in a microscopic semiconductor crystal," JETP Lett., vol. 40, No. 8, Oct. 25, 1984, pp. 1136-1139.

Ekimov et al., "Quantum Size Effect in Semiconductor Microcrystals," Solid State Communications, vol. 56, No. 11, pp. 921-924 (1985).

Ekimov et al., "Quantization of the energy spectrum of holes in the adiabatic potential of the electron," JETP Lett., vol. 43, No. 6, Mar. 25, 1986, pp. 376-379.

Ekimov etal., "Nonlinear Optics of Semiconductor-Doped Glasses," Phys. Stat. Sol. (b) 150, (1988) pp. 627-633.

Ekimov et al., "Photoluminescence of quasizero-dimensional semiconductor structures," Sov. Phys. Solid State 31(8), Aug. 1989, pp. 1385-1393.

Ekimov et al., "Donor-like Exciton in Zero-Dimension Semiconductor Structures," Solid State Communications, vol. 69, No. 5, pp. 565-568 (1989).

Ekimov etal., "Influence of high hydrostatic pressures on the exciton spectrum of CdS microcrystals in glass," Sov. Phys. Semicond. 23(9), Sep. 1989, pp. 965-966.

Ekimov et al., "Quantum-Size Stark Effect in Semiconductor Microcrystals," Journal of Luminescence 46 (1990) 97-100 North-Holland.

Ekimov et al., "Spectra and Decay Kinetics of Radiative Recombination in CdS Microcrystals," Journal of Luminescence 46 (1990) 83-95 North-Holland.

Ekimov et al., "Optics of Zero Dimensional Semiconductor Systems, Acta Physica Polonica A," vol. 79 (1991), No. 1. pp. 5-14.

Ekimov, "Optical Properties of Semiconductor Quantum Dots in Glass Matrix," Physica Scripta, vol. T39, 217-222 (1991).

Ekimov et al., "Dimensional Effects in Luminescence Spectra of Zero-Dimensional Semiconductor Structures," Bulletin of the Russian Academy of Sciences, vol. 56, No. 2, pp. 154-157 (Feb. 1992).

Ekimov et al., "Absorption and intensity-dependent photoluminescence measurements on CdSe quantum dots: assignment of the first electronic transitions," Journal of the Optical Society of America, vol. 10, Nos. 1-12, 100-107 (1992).

Ekimov et al., "Growth of CdSe nanocrystals in ion-implanted $SiO_2$ films," Journal of Crystal Growth 151 (1995) 38-45.

Ekimov, "Optical Properties of Oxide Glasses Doped by Semiconductor Nanocrystals," Radiation Effects and Defects in Solids, 1995, vol. 134, 11-22.

Ekimov, "Growth and optical properties of semiconductor nanocrystals in a glass matrix," Journal of Luminescence 70 (1996) 1-20.

Empedocles et al, "Photoluminescence Spectroscopy of Single CdSe Nanocrystallite Quantum Dots" Phys. Rev. Lett. 77(18):3873-3876 (Oct. 1996).

Empedocles et al., "Quantum-Confined Stark Effect in Single CdSe Nanocrystallite Quantum Dots" Science 278:2114-2117 (Dec. 1997).

Era et al., "Double-Heterostructure Electroluminescent Device with Cyanine-Dye Bimolecular Layer as an Emitter," Chem. Phys. Lett. 1991, 178, 488-490.

Fery, "Nanoporous Thin Films Formed by Salt-Induced Structural Changes in Multilayers of Poly(acrylic acid) and Poly(allylamine)," Langmuir, 2001, 17(13): 3779-3783.

Fukumoto et al., "Layer-by-layer self-assembly of polyelectrolyte and water soluble cyanine dye," Thin Solid Films 1998, 329, 748-751.

Grabovskis, et al., "Photoionization of semiconducting microcrystals in glass," Sov. Phys. Solid State 31(1), Jan. 1989, pp. 149-151.

Guha et al., "Hybrid organic-inorganic semiconductor-based light-emitting diodes" J. Appl. Phys. 82(8):4126-4128 (Oct. 15, 1997).

Gurevich et al., "Growth of CdS nanocrystals in silicate glasses and in thin $SIO_2$ films in the Initial states of the phase separation of a solid solution," Semiconductors, 28 (5), May 1994, 486-493.

Gurevich et al. "Preparation and investigation of $SIO_2$ films activated by CdS semiconductor nanocrystals," Soviet Physics Semiconductors, vol. 26, 57-59 (1992).

Hines et al., "Synthesis and Characterization of Strongly Luminescing ZnS-Capped CdSe Nanocrystals" J. Phys. Chem. 100:468-471 (Jan. 1996).

Hobson et al. "Strong exciton-photon coupling in a low-Q all-metal mirror microcavity," Applied Physics Letters 2002, 81, 3519-3521.

Houdré et al., "Measurement of Cavity-Polariton Dispersion Curve from Angle-Resolved Photoluminescence Experiments," Phys. Rev. Lett. 1994, 73, 2043-2046.

Itoh et al., "Interface effects on the properties of confined excitons in CuCl microcrystals," Journal of Luminescence 60 & 61 (1994) 396-399.

Itoh et al., "Polaron and Exciton-Phonon Complexes in CuCl Nanocrystals," Physical Review Letters, vol. 74, No. 9, Feb. 27, 1995, 1645-1648.

Itoh et al., "Subpicosecond dynamics of confined excitons in CuCl nanocrystals," Materials Science and Engineering A217/218 (1996) 167-170.

Jelley, Nature 1936, 138, 1009-1010.

Jursenas et al., "Surface Recombination of Nonequilibrium Electron-Hole Plasma in Laser-Modified Semiconductor-Doped Glasses," Solid State Communications, vol. 87, No. 6, 577-580 (1993).

Kagan et al., "Electronic Energy Transfer in CdSe Quantum Dot Solids," Physical Review Letters, 76:1517-1520 (1996).

Kagan et al., "Long-range resonance transfer of electronic excitations in close-packed CdSe quantum-dot solids," Physical Review Letters, 54:8633-8643 (Sep. 15, 1996).

Kavokin et al., "Semiconductor microcavities: towards polariton lasers," MRS Internet Journal of Nitride Semiconductor Research 2003, 8(3).

Knupfer, "Exciton binding energies in organic semiconductors," Applied Physics A: Materials Science & Processing 2003, 77, 623-626.

Kortan et al., "Nucleation and Growth of CdSe on ZnS Quantum Crystallite Seeds, and Vice Versa, In Inverse Micelle Media" J. Am Chem. Soc. 112:1327-1332 (1990).

Kuno et al., "The band edge luminescence of surface modified CdSe nanocrystallites: Probing the luminescing state" J. Chem. Phys. 106(23):9869-9882 (Jun. 1997).

Lawless et al., "Bifunctional Capping of CdS Nanoparticles and Bridging to TiO2" J. Phys. Chem. 99:10329-10335 (1995).

Leatherdale et al., "Photoconductivity in CdSe Quantum Dot Solids," vol. 62, No. 4, pp. 2669-2680, (Jul. 15, 2000).

Lidzey et al., "Room Temperature Polariton Emission from Strongly Coupled Organic Semiconductor Microcavities," Phys. Rev. Lett. 1999, 82, 3316-3319.

Lidzey et al., "Experimental study of light Emission from strongly coupled organic semiconductor microcavities following nonresonant laser excitation," Phys. Rev. B 2002, 65, 195312.

Lublinskaya et al., "CdS nanocrystal growth in thin silica films: evolution of size distribution function", Journal of Crystal Growth 184/185 (1998) 360-364.

Matsumoto et al., "Preparation of Monodisperse CdS Nanocrystals by Size Selective Photocorrosion", J. Phys. Chem.100(32):13781-13785 (1996).

Mattoussi et al., "Electroluminescence from heterostructures of poly(phenylene vinylene) and inorganic CdSe nanocrystals," J. Appl. Phys. 83(12): 7965-7974, 1998.

Mendelsohn, "Fabrication of Microporous Thin Films from Polyelectrolyte Multilayers," Langmuir, 2000, 16: 5017-5023.

Mobius, Scheibe Aggregates, Advanced Materials 1995, 7,437-444.

Murray et al., "Synthesis and Characterization of Nearly Monodisperse CdE (E=S, Se, Te) Semiconductor Nanocrystallites", J. Am. Chem. Soc. 115(19):8706-8715 (1993).

Nirmal et al., "Fluorescence Intermittency in single Cadmium Selenide Nanocrystals" *Nature* 383:802-804 (Oct. 1996).

Reers et al., "J-aggregate formation of a carbocyanine as a quantitative fluorescent indicator of membrane potential," *Biochemistry* 1991, 30, 4480-4486.

Reithmaier et al., "Strong coupling in a single quantum dot—semiconductor microcavity system," *Nature* 2004, 432, 197.

Saba et al., "High-temperature ultrafast polariton parametric amplification in semiconductor microcavities," *Nature* 2001, 414, 731-735.

Saviot et al., "Effects of Resonance on Low-Frequency Raman Scattering From Semiconductor Nanocrystals," Radiation Effects and Defects in Solids, 1995, vol. 137, 45-50.

Saviot et al., "Size dependence of acoustic and optical vibrational modes of CdSe nanocrystals in glasses," Journal of Non-Crystalline Solids 197 (1996) 238-246.

Saviot et al., "Size-selective resonant Raman scattering in CdS doped glasses," Physical Review B, vol. 57, No. 1, Jan. 1, 1998-I, 341-346.

Savona et al., "Quantum well excitons in semiconductor microcavities: Unified treatment of weak and strong coupling regimes," *Solid State Communications* 1995, 93, 733-739.

Schlamp et al., "Improved efficiencies in light emitting diodes made with CdSe(CdS) core/shell type nanocrystals and a semiconducting polymer", J. Appl. Phys., 82, 5837-5842 (1997).

Shiratori, "pH-Dependent Thickness Behavior of Sequentially Adsorbed Layers of Weak Polyelectrolytes," *Macromolecules*, 2000, 33: 4213-4219.

Sirenko et al., "Spin-flip and acoustic-phonon Raman scattering in CdS nanocrystals", Physical Review B, vol. 58, No. 4, 15 (Jul. 1998-II), 2077-2087.

Skolnick et al., "Strong coupling phenomena in quantum microcavity structures," *Semiconductor Science and Technology* 1998, 13, 645-669.

Spanhel et al., "Photochemistry of Colloidal Semiconductors. Surface Modification and Stability of Strong Luminescing CdS Particles" J. Am. Chem. Soc.109(19):5649-5655 (1987).

Tamulaitis et al., "Dynamics of Nonlinear Optical Response of CuBr-Doped Glasses," Superlattices and Microstructures, vol. 3, No. 2, 199-202 (1993).

Tischler et al., "Strong Coupling in a Microcavity LED," Phys. Rev. Lett. 2005, 95, 036401.

Tuszynski et al., "Mechanisms of exciton energy transfer in Scheibe aggregates," *Phys. Rev. E* 1999, 59, 4374-4383.

Valenta et al., "Dynamics of excitons in CuBr nanocrystals: Spectral-hole burning and transient four-wave-mixing measurements," Physical Review B, vol. 57, No. 3, Jan. 15, 1998-I, 1774-1783.

Vanburgel, M., et al., "The dynamics of one-dimensional excitons in liquids," *J. Chem. Phys.* 1995, 102, 20-33.

Vandyshev et al., "Nonlinear optical properties of semiconductor microcrystals," JETP Lett., vol. 46, No. 10, Nov. 25, 1987 pp. 435-439.

Volkov et al., "Oscillations of polarization of recombination radiation of a variable gap semiconductor in a magnetic field," JETP Lett., vol. 25 No. 55, 526-528 (1977).

Weisbuch et al., "Observation of the coupled exciton-photon mode splitting in a semiconductor quantum microcavity," *Phys. Rev. Lett.* 1992, 69, 3314-3317.

Yamasaki et al., "Organic light-emitting device with an ordered monolayer of silica microspheres as a scattering medium", Appl. Phys. Lett. 76, 1243-1245 (2000).

Yoshie et al., "Vacuum Rabi splitting with a single quantum dot in a photonic crystal nanocavity," *Nature* 2004, 432, 200.

Hegarty et al., "Resonant Rayleigh Scattering from an Inhomogeneously Broadened Transition: A New Probe of the Homogeneous Linewidth," *Phys. Rev. Lett.* 1982, 49, 930.

Ward, "The Optical Constants of Bulk Materials and Films," *IOP Publishing Ltd.* (Bristol, UK 1994).

* cited by examiner

LIGHT EMITTING DEVICE

CLAIM OF PRIORITY

This application claims priority to U.S. provisional patent application No. 60/624,187, filed Nov. 3, 2004, which is incorporated by reference in its entirety.

FEDERALLY SPONSORED RESEARCH OR DEVELOPMENT

This invention was made with government support under Grant Number MDA972-00-1-0023, awarded by DARPA. The government has certain rights in the invention.

TECHNICAL FIELD

The present invention relates to a light emitting device.

BACKGROUND

Light-emitting devices can be used, for example, in displays (e.g., flat-panel displays), screens (e.g., computer screens), and other items that require illumination. Accordingly, the brightness of the light-emitting device is one important feature of the device. Also, low operating voltages and high efficiencies can improve the viability of producing emissive devices.

Light-emitting devices can release photons in response to excitation of an active component of the device. Emission can be stimulated by applying a voltage across the active component (e.g., an electroluminescent component) of the device. The electroluminescent component can be a polymer, such as a conjugated organic polymer or a polymer containing electroluminescent moieties or layers of organic molecules. Typically, the emission can occur by radiative recombination of an excited charge between layers of a device. The emitted light has an emission profile that includes a maximum emission wavelength, and an emission intensity, measured in luminance (candelas/square meter ($cd/m^2$) or power flux ($W/m^2$)). The emission profile, and other physical characteristics of the device, can be altered by the electronic structure (e.g., energy gaps) of the material. For example, the brightness, range of color, efficiency, operating voltage, and operating half-lives of light-emitting devices can vary based on the structure of the device.

SUMMARY

In general, a light emitting device includes an electrically energized light emitting structure which can be situated within a resonantly tuned optical cavity or microcavity. The device can produce exciton-polariton states. An optical microcavity can be constructed out of mirror structures that reflect light in a band of frequency that includes the frequency at which the material capable of producing polaritons absorbs light. Two such mirror structures are sufficient to form the optical cavity provided they are separated by the proper distance. The correct distance to achieve strong coupling is a function of the properties of the materials inside the cavity as well as the property of the mirror materials themselves.

In one aspect, an electrically driven light emitting device includes an optical cavity having a resonant mode and a material having an optical transition within the cavity, wherein the resonant mode and the optical transition are energy matched and strongly coupled. The light emitting device can include a cathode and an anode. The material having an optical transition can include a an inorganic semiconductor, an organic dye, a semiconductor nanocrystal, a J-aggregate, or a combination thereof. The light emitting device can include a region including a multiply charged material disposed between the anode and the cathode. The region can include the material having an optical transition. The region can include an electrostatic bilayer, the bilayer including the multiply charged material and the material having an optical transition.

The multiply charged material can include a polyelectrolyte. The polyelectrolyte can be a polycation or a polyanion. The multiply charged material can include a metal ion. The cavity can be defined by a pair of opposed reflective elements. The reflective elements can include a metal or a dielectric mirror. The material having an optical transition can be located substantially at an anti-node of the optical cavity.

In another aspect, a method of making an electroluminescent device includes forming an optical cavity having a resonant mode and including a material having an optical transition, wherein the resonant mode and the optical transition are energy matched and strongly coupled. Forming the optical cavity can include forming a first layer on a substrate, the first layer including a first reflective element. Forming the optical cavity can include forming a second layer over the first layer, the second layer including a multiply charged material and the material having an optical transition. Forming the optical cavity can include forming a third layer over the second layer, the third layer including a second reflective element. The method can include selecting a thickness between the first layer and the third layer. The thickness can be selected to form an optical cavity having a resonant mode energy matched to the optical transition.

In another aspect, a method of generating light includes electrically exciting a device including an optical cavity having a resonant mode and a material having an optical transition, wherein the resonant mode and the optical transition are energy matched and strongly coupled.

In another aspect, a light emitting device includes a first layer and a second layer opposed to the first layer where the first layer and the second layer are each independently at least partially reflective, a material having an optical transition disposed between the first layer and the second layer, and a thickness between the first layer and the second layer, thereby forming an optical cavity between the first layer and the second layer, where the thickness is selected such that the optical cavity has a resonant mode energy matched to the optical transition.

In another aspect, a method of generating light includes applying a voltage to a device, the device including a first layer and a second layer opposed to the first layer, where the first layer and the second layer are each independently at least partially reflective; a material having an optical transition disposed between the first layer and the second layer; and a thickness between the first layer and the second layer, thereby forming an optical cavity between the first layer and the second layer, where the thickness is selected such that the optical cavity has a resonant mode energy matched to the optical transition.

Other features, objects, and advantages will be apparent from the description and drawings, and from the claims.

DETAILED DESCRIPTION

A light emitting device can include two layers separating two electrodes of the device. The material of one layer can be chosen based on the material's ability to transport holes, or the hole transporting layer (HTL). The material of the other layer can be chosen based on the material's ability to transport electrons, or the electron transporting layer (ETL). The electron transporting layer typically includes an electroluminescent layer. When a voltage is applied, one electrode injects holes (positive charge carriers) into the hole transporting layer, while the other electrode injects electrons into the electron transporting layer. The injected holes and electrons each migrate toward the oppositely charged electrode. When an electron and hole localize on the same molecule, an exciton is formed, which can recombine to emit light.

Figure 1:
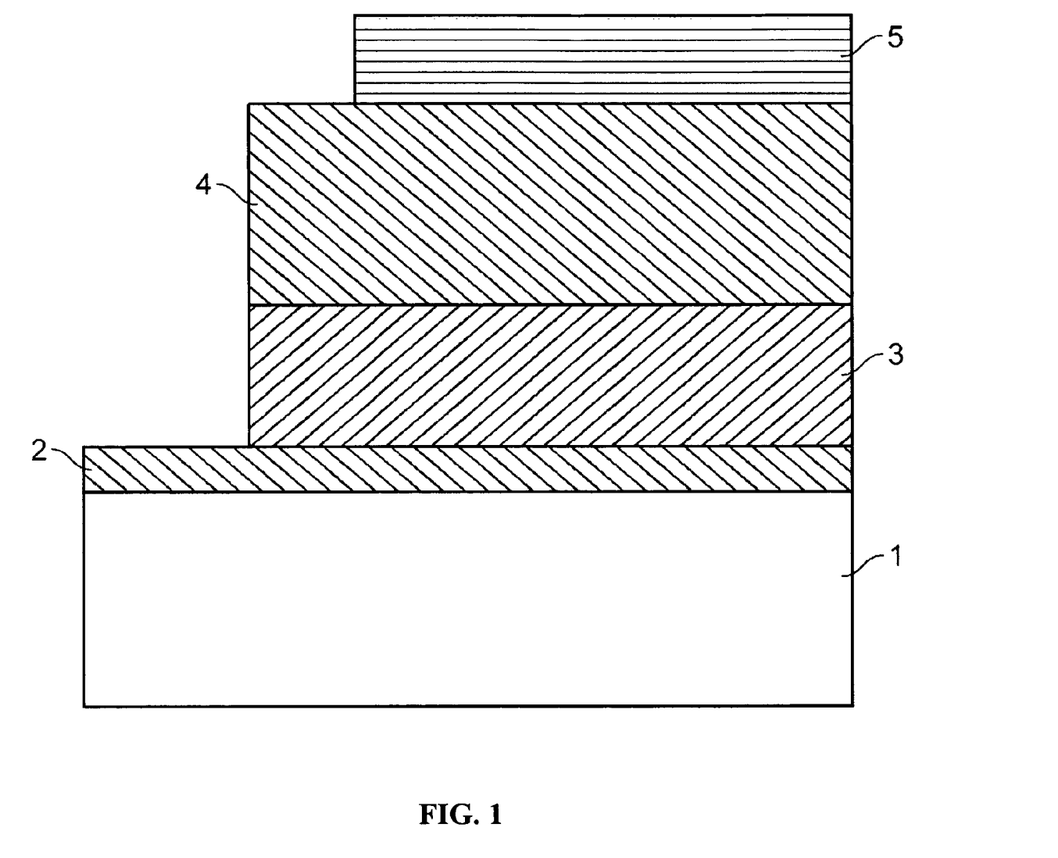
FIG. 1 is a schematic drawing depicting a light-emitting device.

A light emitting device can have a structure such as shown in FIG. 1, in which a first electrode 2, a first layer 3 in contact with the electrode 2, a second layer 4 in contact with the layer 3, and a second electrode 5 in contact with the second layer 4. First layer 3 can be a hole transporting layer and second layer 4 can be an electron transporting layer. At least one layer can be non-polymeric. Alternatively, a separate emissive layer (not shown in FIG. 1) can be included between the hole transporting layer and the electron transporting layer. One of the electrodes of the structure is in contact with a substrate 1. Each electrode can contact a power supply to provide a voltage across the structure. Electroluminescence can be produced by the emissive layer of the heterostructure when a voltage of proper polarity is applied across the heterostructure.

The light emitting device can include an optical cavity. The optical cavity can be formed, for example, by electrode 2 and electrode 5. Electrode 2 and electrode 5 can each include a reflective element (such as, for example, a layer of silver, or a dielectric mirror). The optical cavity can have a resonant mode determined by the thickness of layers 3 and 4 between the electrodes. The optical cavity can be a microcavity. The cavity can include reflective elements made of materials that are metallic, dielectric, polymeric, semiconducting or any combination thereof. Silver, gold, and aluminum are examples of metallic materials that can be used. An example of a dielectric material-based reflector (i.e., dielectric mirror) is a stack of dielectric layers in which the refractive index varies periodically in the stack, and the thickness of each layer is chosen to provide high reflection at the resonant frequency of interest.

The light emitting device can include an emissive material. The emissive material can have an optical transition (i.e., an absorption wavelength). The optical transition of the emissive material can be resonantly coupled to the optical cavity. In other words, the energy of the optical transition of the emissive material can match the energy of resonant mode of the optical cavity. In other words, the optical transition and resonant mode are energy matched. The optical transition can be a strong, narrow-band absorbance. When the optical transition is a sufficiently strong and narrow-band absorbance, and the optical transition and resonant mode are energy matched, there can be strong coupling between them. See, for example, P. R. Berman, Advances in Atomic, Molecular, and Optical Physics, edited by B. Benderson (Academic Press, Inc., New York, 1994); T. Yoshie, et al., Nature (London) 432, 200 (2004); and J. P. Reithmaier, Nature (London) 432, 197 (2004), each of which is incorporated by reference in its entirety. When strong coupling is present, device can produce exciton-polariton states. As a result of the coupling between the optical transition of the emissive material and the resonant mode of the cavity, two light emission peaks and corresponding reflectivity extrema occur at higher and lower energy with respect to the resonance of the optical cavity.

There can be more than one material present in the optical cavity capable of interacting with light. The material with strong and narrow-band absorbance optical transition which produces the strong coupling does not need to be directly electrically excited in order to produce electrical exciton-polariton light emission. Rather this strong coupling material must be present in the microcavity containing a different, electrically excited material. Furthermore, the electrically excited material need not be narrow band, or even independently emissive. The electrically excited material need only transfer energy to the exciton-polariton resonance. Transfer can be either by radiating energy in the form of light directly to one of the polariton states, or by transferring energy to the material that generates the strong coupling.

The material strongly coupled to the microcavity can be a thin film including one or more optically active materials that possess a sufficiently strong and narrow-band absorbance optical transition. Exemplary materials include crystalline inorganic semiconductors that have excitonic states, such as GaN, ZnO, GaAs, CuCl, etc.; crystalline organics such as 3,3'-diethyloxadicarbocyanine iodide; inorganic nanocrystals such as semiconductor nanocrystals, nanotubes, and nanorods; nanostructured organic materials such as J-aggregates (e.g., of cyanine dyes) and carbon nanotubes; or amorphous organic materials which also possess strong absorbance optical transitions.

The electrically excited material within the device may be one of the above-mentioned materials generating the strong coupling, or it can be a secondary material also present in the microcavity. If a secondary material is used, it does not need to be capable of strong coupling to the optical cavity. The secondary material only needs to be capable of converting electrical excitation into excited states whose energy can be transferred (radiatively or non-radiatively) to the material participating in the strong coupling, or transferred directly to the polariton states. Examples of such secondary materials are numerous and can include inorganic diode materials of any kind: light emitting diode materials and solar cell materials, as well as organic light emitting diode materials and solar cell materials.

The emissive material and secondary material (if present) can applied by layer-by-layer processing. Layer-by-layer processing of polyelectrolyte multilayers can be utilized to fabricate conformal thin film coatings with molecular level control over film thickness and chemistry. Charged polyelectrolytes can be assembled in a layer-by-layer fashion. In other words, positively- and negatively-charged polyelectrolytes can be alternately deposited on a substrate. One method of depositing the polyelectrolytes is to contact the substrate with an aqueous solution of polyelectrolyte at an appropriate pH. The pH can be chosen such that the polyelectrolyte is partially or weakly charged. The multilayer can include a number of electrostatic bilayers. An electrostatic bilayer is the structure formed by the ordered application of a multiply charged species (e.g., a polyelectrolyte or metal ion) and an oppositely charged material (e.g., a light absorbing material, polyelectrolyte or counterion). See, for example, G. Decher, Science 1997, 277, 1232; Mendelsohn et al., Langmuir 2000, 16, 5017; Fery et al., Langmuir 2001, 17, 3779; Shiratori et al., Macromolecules 2000, 33, 4213, each of which is incorporated by reference in its entirety. A coating of this type can be applied to any surface amenable to the water based layer-by-layer (LbL) adsorption process used to construct these polyelectrolyte multilayers. Because the water based process can deposit polyelectrolytes wherever the aqueous solution contacts a surface, even the inside surfaces of objects having a complex topology can be coated. In general, a polyelectrolyte can be applied to a surface by any method amenable to applying an aqueous solution to a surface, such as dipping or spraying.

Layers of light absorbing material, which can be positively or negatively charged, can be interspersed with layers of an oppositely charged material. The oppositely charged material can include a multiply charged species. A multiply charged species can have a plurality of charge sites each bearing a partial, single, or multiple charge; or a single charge site bearing a multiple charge. A polyelectrolyte, for example, can have a plurality of charge sites each bearing a partial, single, or multiple charge. A polyelectrolyte has a backbone with a plurality of charged functional groups attached to the backbone. A polyelectrolyte can be polycationic or polyanionic. A polycation has a backbone with a plurality of positively charged functional groups attached to the backbone, for example poly(allylamine hydrochloride). A polyanion has a backbone with a plurality of negatively charged functional groups attached to the backbone, such as sulfonated polystyrene (SPS), polyacrylic acid, or a salt thereof. Some polyelectrolytes can lose their charge (i.e., become electrically neutral) depending on conditions such as pH. Some polyelectrolytes, such as copolymers, can include both polycationic segments and polyanionic segments. The charge density of a polyelectrolyte in aqueous solution can be pH insensitive (i.e., a strong polyelectrolyte) or pH sensitive (i.e., a weak polyelectrolyte). Without limitation, some exemplary polyelectrolytes are poly diallyldimethylammonium chloride (PDAC, a strong polycation), poly allylamine hydrochloride (PAH, a weak polycation), sulfonated polystyrene (SPS, a strong polyanion), and poly acrylic acid (PAA, a weak polyanion). Examples of a single charge site bearing a multiple charge include multiply charged metal ions, such as, without limitation, $Mg^{2+}$, $Ca^{2+}$, $Zn^{2+}$, $Fe^{2+}$, $Fe^{3+}$, $Co^{2+}$, $Cu^{2+}$, $Cd^{2+}$, $Sn^{4+}$, $Eu^{3+}$, $Tb^{3+}$, and the like. Multiply charged metal ions are available as salts, e.g. chloride salts such as $CoCl_2$, $FeCl_3$, $EuCl_3$, $TbCl_3$, $CdCl_2$, and $SnCl_4$.

The film can include hydrogen bonding polymers, such as, for example, polyacrylamide (PAm), polyvinylpyrolidone (PVP), and polyvinyl alcohol (PVA). The light absorbing film can include more than two materials. One of these materials is the light absorbing material and one of the other materials is either a multivalent ionic species or hydrogen bonding polymer. Additional materials may be included in the film to promote crosslinking, adhesion, or to sensitize light emission or absorption.

The thin films can include one or several layers of a polyelectrolyte and one or more charged species with strong dipole-dipole interactions and any additional dopants. At least one of the charged species used for strong dipole-dipole interactions has a charge opposite that of the polyelectrolyte used for the scaffold. When sequentially applied to a substrate, the oppositely charged materials attract forming an electrostatic bilayer. The polyelectrolyte provides a scaffold for the species with strong dipole-dipole interactions to form a layered structure. These films are compatible with other processes of building thin films through alternate adsorption of charged species. The films can be interspersed in a multifilm heterostructure with other thin films.

The process conditions used in the deposition of the film can be varied. Some process conditions that can be varied include concentration, temperature, pH, salt concentration, co-solvent, co-solvent concentration, and deposition time. The temperature can be varied between, for example, 0° C. and 100° C., or between 5° C. and 80° C. The pH can be varied from 0.0 to 14.0, or from 3.0 to 13.0. The salt concentration can range from deionized (i.e., no salt added) to 1 M. NaCl and KCl are examples of salts used. Solutions can be prepared using water as the sole solvent, or with water and a co-solvent, such as an organic solvent. Some exemplary organic solvents include methanol, ethanol, isopropanol, acetone, acetic acid, THF, dioxane, DMF, and formamide. The deposition time can be 1 second or less; 30 seconds or less; 1 minute or less; 5 minutes or less; 10 minutes or less; 1 hour or less; or several hours or more. In some circumstances, deposition times will be in the range of 1 second to 10 minutes.

The density of the film can be modified by repeatedly immersing the substrate into solutions of the light absorbing material prepared with different process conditions. As an example, by cyclically immersing into a solution held at a temperature of 20° C. and then in a second solution held at 60° C. The crystallinity of the resultant film is enhanced and dye density increased compared to films not treated in this manner.

The film can include a plurality of bilayers, such as fewer than 100, fewer than 50, fewer than 20, or fewer than 10 bilayers. The film can include 0.5, 1.0, 1.5, 2.0, 2.5, 3.0, 3.5, 4.0, 4.5, 5.0, 5.5, 6.0, 6.5, 7.0, 7.5, 8.0, 8.5, 9.0, 9.5, or 10.0 bilayers. A bilayer includes a layer of multiply charged material and a layer of light absorbing material. In some embodiments, the film can include bilayers substantially free of light absorbing material, e.g., bilayers where one layer includes a polycation and the other layer includes a polyanion. Including bilayers that are substantially free of light absorbing material can be advantageous, for example, in altering the adhesion of the film to a substrate or in altering the thickness of the film.

The light absorbing film can be deposited on a hydrophilic or hydrophobic substrate. The film can be deposited onto conducting (e.g., metallic), semiconducting, or insulating layers; or bio-compatible materials, examples of which are a polymer film that is hydrophilic or hydrophobic, an oxide layer, a metal oxide layer, a metal layer, a DNA-coated surface, and others. Examples of a hydrophilic polymer layer include polyelectrolytes and hydrogen bonding polymers; amino acids; proteins; and hydrophilic polymers. Examples of hydrophobic polymers include PDMS, Poly-TPD, and MEH-PPV. Metal oxide layers include, for example alumina, titania, and zinc oxide. Examples of semiconducting layers are layers of Si, Ge, GaAs, GaN, AlGaAs, GaAsP, CdSe, CdS, ZnS, and metal halides, such as AgCl, AgBr, and AgI. Adhesion of the light absorbing film to the substrate can be promoted by varying the process conditions described above.

The charged species with strong dipole-dipole interactions can be a single type of species, such as a single type of J-aggregating material (for example, a cyanine dye). Alternatively, several charged species with strong dipole-dipole interactions among the species could be used. The species used for the strong dipole-dipole interacting layer can have individual dipoles that can couple together to produce a coherent quantum mechanical state. This allows for the buildup of coherence in two dimensions, producing effects in the probe dimension perpendicular to the interacting species.

The substrate can be opaque or transparent. The substrate can be rigid or flexible. The substrate can be plastic, metal or glass. The first electrode can be, for example, a high work function hole-injecting conductor, such as an indium tin oxide (ITO) layer. Other first electrode materials can include gallium indium tin oxide, zinc indium tin oxide, titanium nitride, or polyaniline. The second electrode can be, for example, a low work function (e.g., less than 4.0 eV), electron-injecting, metal, such as Al, Ba, Yb, Ca, a lithium-aluminum alloy (Li:Al), or a magnesium-silver alloy (Mg:Ag). The second electrode, such as Mg:Ag, can be covered with an opaque protective metal layer, for example, a layer of Ag for protecting the cathode layer from atmospheric oxidation, or a relatively thin layer of substantially transparent ITO. The first electrode can have a thickness of about 500 Angstroms to 4000 Angstroms. The first layer can have a thickness of about 50 Angstroms to about 1000 Angstroms. The second layer can have a thickness of about 50 Angstroms to about 1000 Angstroms. The second electrode can have a thickness of about 50 Angstroms to greater than about 1000 Angstroms.

The electron transporting layer (ETL) can be a molecular matrix. The molecular matrix can be non-polymeric. The molecular matrix can include a small molecule, for example, a metal complex. For example, the metal complex can be a metal complex of 8-hydroxyquinoline. The metal complex of 8-hydroxyquinoline can be an aluminum, gallium, indium, zinc or magnesium complex, for example, aluminum tris(8-hydroxyquinoline) ($Alq_3$). Other classes of materials in the ETL can include metal thioxinoid compounds, oxadiazole metal chelates, triazoles, sexithiophene derivatives, pyrazine, and styrylanthracene derivatives. The hole transporting layer can include an organic chromophore. The organic chromophore can be a phenyl amine, such as, for example, N,N'-diphenyl-N,N'-bis(3-methylphenyl)-(1,1'-biphenyl)-4,4'-diamine (TPD). The HTL can include a polyaniline, a polypyrrole, a poly(phenylene vinylene), copper phthalocyanine, an aromatic tertiary amine or polynuclear aromatic tertiary amine, a 4,4'-bis(9-carbazolyl)-1,1'-biphenyl compound, or an N,N,N',N'-tetraarylbenzidine.

The layers can be deposited on a surface of one of the electrodes by spin coating, dip coating, vapor deposition, layer-by-layer processing, or other thin film deposition methods. The second electrode can be sandwiched, sputtered, or evaporated onto the exposed surface of the solid layer. One or both of the electrodes can be patterned. The electrodes of the device can be connected to a voltage source by electrically conductive pathways. Upon application of the voltage, light is generated from the device.

The device can be made in a controlled (oxygen-free and moisture-free) environment, preventing the quenching of luminescent efficiency during the fabrication process. Other multilayer structures may be used to improve the device performance (see, for example, U.S. patent application Ser. Nos. 10/400,907 and 10/400,908, each of which is incorporated by reference in its entirety). A blocking layer, such as an electron blocking layer (EBL), a hole blocking layer (HBL) or a hole and electron blocking layer (eBL), can be introduced in the structure. A blocking layer can include 3-(4-biphenylyl)-4-phenyl-5-tert-butylphenyl-1,2,4-triazole (TAZ), 3,4,5-triphenyl-1,2,4-triazole, 3,5-bis(4-tert-butylphenyl)-4-phenyl-1,2,4-triazole, bathocuproine (BCP), 4,4',4"-tris{N-(3-methylphenyl)-N-phenylamino}triphenylamine (m-MTDATA), polyethylene dioxythiophene (PEDOT), 1,3-bis(5-(4-diphenylamino)phenyl-1,3,4-oxadiazol-2-yl)benzene, 2-(4-biphenylyl)-5-(4-tert-butylphenyl)-1,3,4-oxadiazole, 1,3-bis[5-(4-(1,1-dimethylethyl)phenyl)-1,3,4-oxadiazol-2-yl]benzene, 1,4-bis(5-(4-diphenylamino)phenyl-1,3,4-oxadiazol-2-yl)benzene, or 1,3,5-tris[5-(4-(1,1-dimethylethyl)phenyl)-1,3,4-oxadiazol-2-yl]benzene.

The performance of organic light emitting devices can be improved by increasing their efficiency, narrowing or broadening their emission spectra, or polarizing their emission. See, for example, Bulović et al., Semiconductors and Semimetals 64, 255 (2000), Adachi et al., Appl. Phys. Lett. 78, 1622 (2001), Yamasaki et al., Appl. Phys. Lett. 76, 1243 (2000), Dirr et al., Jpn. J. Appl. Phys. 37, 1457 (1998), and D'Andrade et al., MRS Fall Meeting, BB6.2 (2001), each of which is incorporated herein by reference in its entirety.

Exciton-polaritons present inside semiconductor microcavity structures are quasiparticles composed of excitons strongly coupled to the photon field of the microcavity. Exciton-polariton photoluminescence, parametric amplification, and more recently evidence of optically-pumped low-threshold optical bi-stability have been demonstrated, all relying on optical pumping of polariton structures. See, for example, Weisbuch, C., et al. *Physical Review Letters* 69, 3314-3317 (1992); Houdre, R. et al. *Physical Review Letters* 73, 2043-2046 (1994); Saba, M. et al. *Nature* 414, 731-735 (2001); Deng, H., et al. *Science* 298, 199-202 (2002); and Baas, A., et al. *Physical Review A* 69 (2004), each of which is incorporated by reference in its entirety.

Exciton-polariton electroluminescence (EL), a step towards development of active exciton-polariton optoelectronics, can be achieved by electrically exciting thin films of J-aggregated cyanine dyes embedded within a resonant cavity organic light emitting device (RC-OLED). Remarkably, the exciton-polariton EL signature was demonstrated at room temperature, due to the high absorption constant of the J-aggregates ($\alpha_{max} \sim 10^6$ cm$^{-1}$), their high exciton binding energy, and relatively narrow luminescence linewidth (~25 meV in the visible). See, for example, Lidzey, D. G. et al. *Physical Review Letters* 82, 3316-3319 (1999); Knupfer, M. *Applied Physics a-Materials Science & Processing* 77, 623-626 (2003); Coe, S., et al. *Nature* 420, 800-803 (2002); and provisional U.S. Application No. 60/624,198, filed Nov. 3, 2004, each of which is incorporated by reference in its entirety. The exciton-polariton resonances in the EL, reflectivity, and photoluminescence (PL) spectra were most strongly pronounced when the microcavity was resonantly tuned to the J-aggregate exciton wavelength λ=595 nm, resulting in a room temperature Rabi-splitting of 265±15 meV between the exciton-polariton peaks. The exceptionally large Rabi-splitting (an order of magnitude larger than in inorganic quantum well structures) was a consequence of the high oscillator strength of the J-aggregate films. See, for example, Kavokin, A., et al. *MRS Internet Journal of Nitride Semiconductor Research* 8 (2003), which is incorporated by reference in its entirety. The J-aggregate films were prepared by a layer-by-layer dip-coating technique. See, for example, Fukumoto, H. et al. *Thin Solid Films* 329, 748-751 (1998), which is incorporated by reference in its entirety. The deposition method enables the J-aggregate layers to be placed at the anti-node of the microcavity to maximize the light-matter coupling. The exciton generation region of the RC-OLED was placed at the same location.

Figure 2:
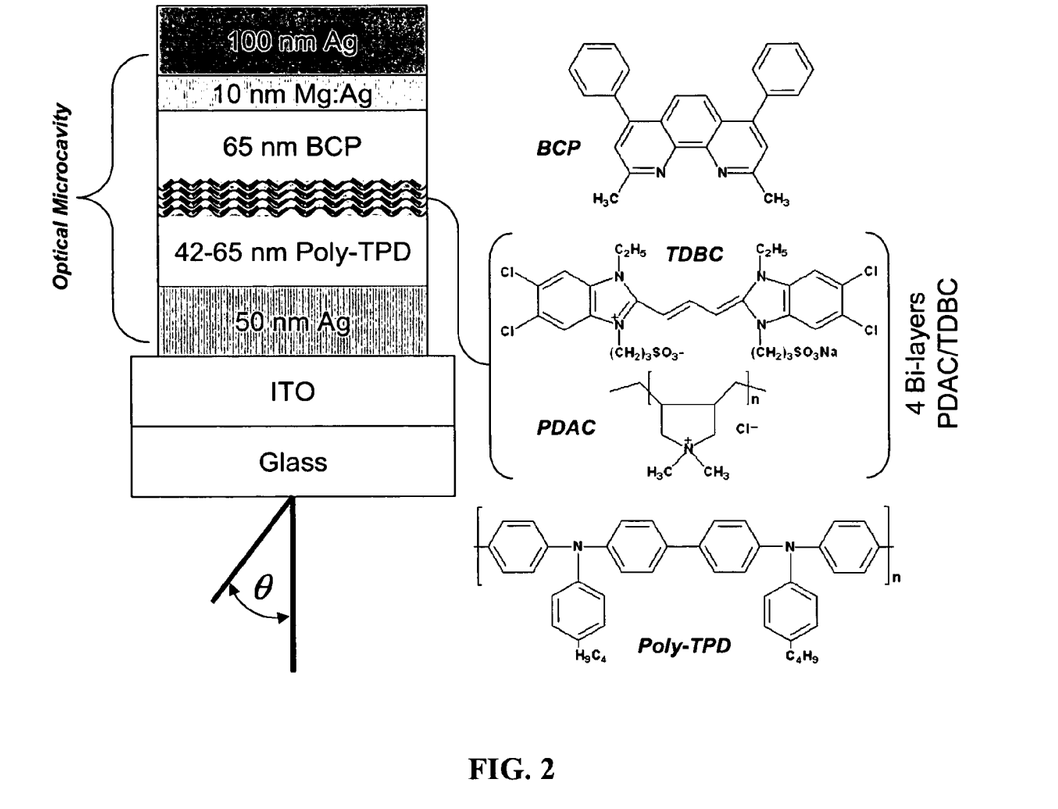
FIG. 2 is a schematic drawing depicting a polariton resonant cavity organic light emitting device (RC-OLED).

The resonant cavity organic LED (RC-OLED) structure used to measure exciton-polariton EL is shown in FIG. 2, and its fabrication described in the Methods section. Specifically, the substrate was pre-cleaned indium tin oxide (ITO) sputtered glass. The metal layers were the mirrors of the microcavity as well as the electrical contacts to the semiconducting and emissive organic layers sandwiched between them. A 50 nm layer of evaporated Ag was the anode, which was semi-transparent to allow partial light transmission. The cathode mirror was composed of a 10 nm Mg:Ag alloy layer that facilitates electron injection into the organic layers, capped with 100 nm of Ag. The organic layers were selected to impart a double heterojunction to the J-aggregate emissive layer, with the poly-TPD and BCP layers chosen to function as wide bandgap (>2.9 eV) hole and electron transport layers, respectively. See, for example, Era, M., et al. *Chemical Physics Letters* 178, 488-490 (1991), which is incorporated by reference in its entirety. The poly-TPD layer was spin-cast, and for different devices its thickness is varied from 42 nm to 65 nm to tune the cavity-exciton interaction. The exciton generation layer consisted of a 5±2 nm thick film of high oscillator strength J-aggregated cyanine dyes, comprised of 4 bi-layers of sequentially dip-coated polyelectrolyte (PDAC) and J-aggregated cyanine dye (TDBC).

The J-aggregate excitons were generated in a 5±2 nm thick film consisting of 4 bi-layers of the polyelectrolyte PDAC (poly diallyldimethylammonium chloride) and the cyanine dye TDBC (5,6-dichloro-2-[3-[5,6-dichloro-1-ethyl-3-(3-sulfopropyl)-2(3H)-benzimidazolidene]-1-propenyl]-1-ethyl-3-(3-sulfopropyl) benzimidazolium hydroxide, inner salt, sodium salt). The 4 bi-layer film of J-aggregated dye possessed a large absorption constant ($\alpha_{max} \sim 1.0 \times 10^6$ cm$^{-1}$; this value was derived from a T-matrix model of the surface reflectance and transmission data of the uncoupled J-aggregate peak versus film thickness) and narrow linewidth (reflectance spectrum FWHM=19 nm, FIG. 3(A)), and was positioned at or near the anti-node of the microcavity formed by the two metal electrodes. With a 50 nm thick Ag anode mirror the quality factor of the microcavity was Q=10. See, for example, Hobson, P. A. et al. *Applied Physics Letters* 81, 3519-3521 (2002), which is incorporated by reference in its entirety. A typical device was between 112 nm to 135 nm thick, not including the metal mirror thickness, and passed 0.1 A cm$^{-2}$ of current at 10 V applied bias.

FIG. 3A shows the reflectivity spectrum of a polariton RC-OLED (thick line) compared to thin film reflectivity spectrum of 4 bi-layers of polyelectrolyte/J-aggregate on glass (thin line). The reflectivity was measured at θ=7°, using the surface reflectivity accessory (SRA) of a Cary500i spectrophotometer. FIG. 3B shows normalized photoluminescence (PL) spectra of a polariton RC-OLED at θ=0° excited with λ=408 nm laser, compared to PL of the J-aggregate film on glass excited with λ=500 nm light and collected at θ=30°, using a SPEX fluorimeter. FIG. 3C shows normalized electroluminescence (EL) spectra of a polariton RC-OLED compared to EL of an uncoupled J-aggregate OLED.

The spectral properties of the RC-OLED differed dramatically from an uncoupled OLED structure, i.e., one with the same organic layer thicknesses but without the 50 nm semi-transparent Ag mirror. Such an OLED is referred to as uncoupled, even though it still exhibits microcavity effects, due to the half-cavity consisting of Metal and ITO and the high oscillator strength of the J-aggregate layers. These weaker microcavity effects explained the lower energy shoulder in EL of the uncoupled device that is not present in the PL of the neat film of 4 PDAC/TDBC bi-layers). The forward (θ=0°) EL spectrum of the uncoupled OLED had one emission peak at λ=602 nm (FWHM=23 nm), corresponding to the resonance of the uncoupled TDBC J-aggregate exciton. In the RC-OLED structure with 124 nm thick organic films, the single emission peak split into two peaks located at λ=546 nm and λ=622 nm (FIG. 3C). This splitting was also observed in the reflectivity (FIG. 3A) and PL measurements (FIG. 3B) of the RC-OLED, with two resonant dips in reflectivity at λ=554 nm and λ=625 nm and PL peaks at λ=543 nm and λ=619 nm. In contrast, 4 bi-layers of PDAC/TDBC on glass had a single reflectivity resonance at λ=595 nm (FWHM=19 nm), and single PL peak at λ=596 nm (FWHM=13 nm).

Figure 3:
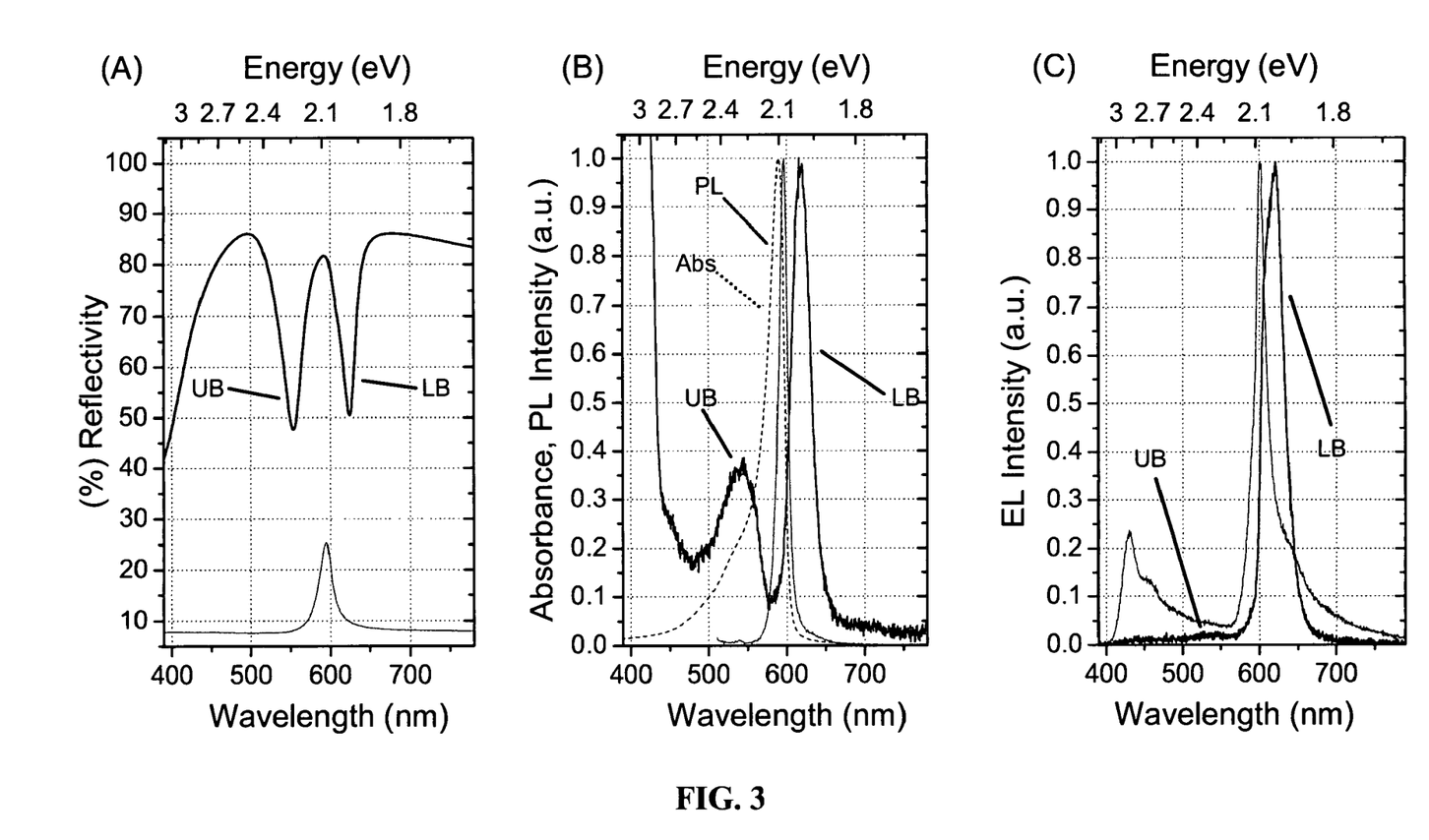
FIGS. 3A-3C are graphs depicting reflectivity, photoluminescence, and electroluminescence measurements of a single polariton RC-OLED.

The large splitting between the emission peaks of the FIG. 3 RC-OLED was due to the strong quantum coupling between the J-aggregate exciton (λ=595 nm) and the photon field of the microcavity of closely matched wavelength (the uncoupled microcavity of the FIG. 3 RC-OLED would produce a photon resonance at λ=587 nm in reflectivity). Because of strong coupling, the exciton and cavity were exchanging energy at a faster rate than the respective dephasing processes. Those processes are dephasing due to spontaneous emission of the J-aggregate exciton and photon dephasing due to light leakage from the cavity (see, for example, Skolnick, M. S., et al. *Semiconductor Science and Technology* 13, 645-669 (1998), which is incorporated by reference in its entirety), and as a result new eigenstates form with energy levels, $E_\pm$, separated from the uncoupled exciton and photon energy levels, $E_{ex}$ and $E_{ph}$, respectively:

$$E_\pm = \frac{E_{ex} + E_{ph}}{2} \pm \frac{1}{2}\sqrt{(\hbar\Omega_i)^2 + (E_{ex} + E_{ph})^2}, \quad (\text{Eq. 1})$$

The energy separation, $E_+ - E_-$ was dependent on the degree of energy matching between the exciton and photon modes, and had a minimum of $\hbar\Omega_i$ when the exciton and photon were resonant, i.e., when $E_{ex} = E_{ph}$. $\Omega_i$ was the exciton-photon vacuum Rabi coupling frequency, which increased with the strength of the exciton-photon interaction. The small Stokes shift, <5 nm, between TDBC film emission and absorption contributed to efficient reabsorption of the TDBC PL, which enhanced the strength of light-matter coupling.

FIG. 4A displays EL of a series of RC-OLEDs with different thickness of the poly-TPD layer. The poly-TPD thickness was tuned by choosing the spinner speed during the spinning process (see methods section), resulting in the poly-TPD layer thickness varying from 42 nm to 65 mm, as indicated in FIGS. 4A-4C. This variation translated into a 250 meV tuning range for the cavity resonance according to a T-matrix simulation, centered about the TDBC J-aggregate resonance at λ=595 nm. The emission intensity was normalized relative to the lower energy peak. The inset of FIG. 4A shows an expanded view of the high-energy portion of the EL spectra, revealing the upper branch emission peak. The intensity was normalized to the peak emission in the range of λ=475 nm to λ=575 nm. FIG. 4B shows surface reflectivity (θ=7°) for a similar series of RC-OLED structures, with different thickness of the poly-TPD layer. FIG. 4C shows the resonant peaks in EL emission (solid data points) and resonant dips in reflectivity (open data points) that were split-off from the uncoupled excitonic resonance were plotted as a function of the uncoupled microcavity resonance. The higher (lower) energy peaks form the upper (lower) branch of the polariton dispersion relation respectively. The fits to the data were generated by the two-state model of Eq. 1. The splitting between the two branches was also plotted, with a Rabi-splitting of $\hbar\Omega_i = 265 \pm 15$ meV occurring when the cavity was tuned to 2.08 eV.

Figure 4:
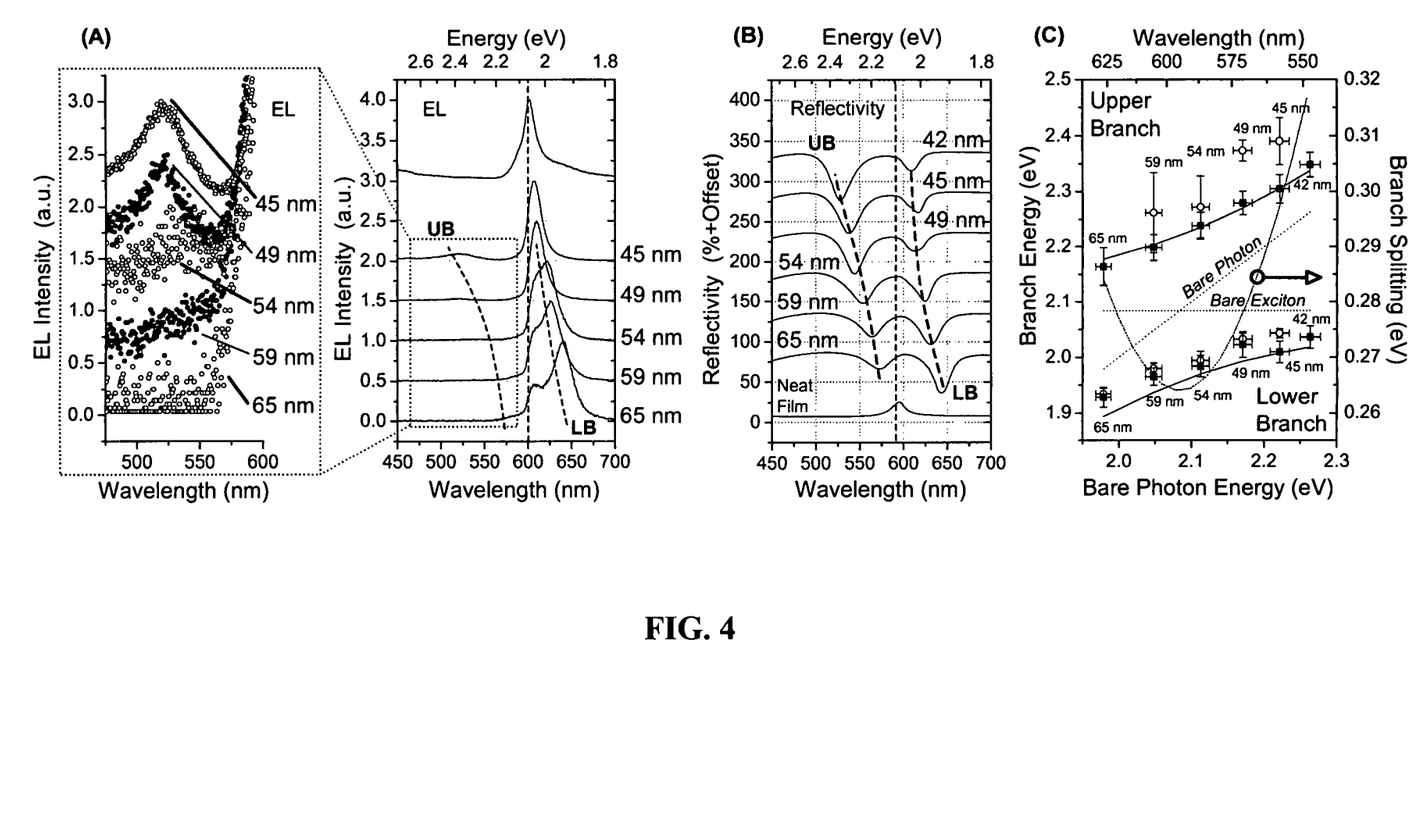
FIGS. 4A-4C are graphs depicting polariton electroluminescence at θ=0° and reflectivity at θ=7° for a series of RC-OLEDs with different microcavity thickness.

The dispersion of polariton energy levels $E_\pm$ described by Eq. 1 is evidenced in FIG. 4, which plots EL and reflectivity in θ=0° direction of five RC-OLEDs with different microcavity thicknesses. As the poly-TPD layer thickness was varied from 65 nm to 42 nm, $E_{ph}$ was tuned between 1.98 eV and 2.26 eV, spanning the energy range that encompasses the J-aggregate exciton resonance, $E_{ex}$=2.08 eV ($\lambda_{ex}$=595 nm). As a result, the separation between the resonant dips in reflectivity (FIG. 4B) varied from more than 300 meV, when the exciton and photon were far off-resonance to a minimum of $\hbar\Omega_i$=265±15 meV, when $E_{ex}$=$E_{ph}$, which corresponded to a thickness of 56 nm for the poly-TPD layer. Similarly, the $E_\pm$ EL spectral peaks (FIG. 4A) were greatly separated off-resonance and then approached each other as the microcavity was tuned through the exciton energy.

Figure 5:
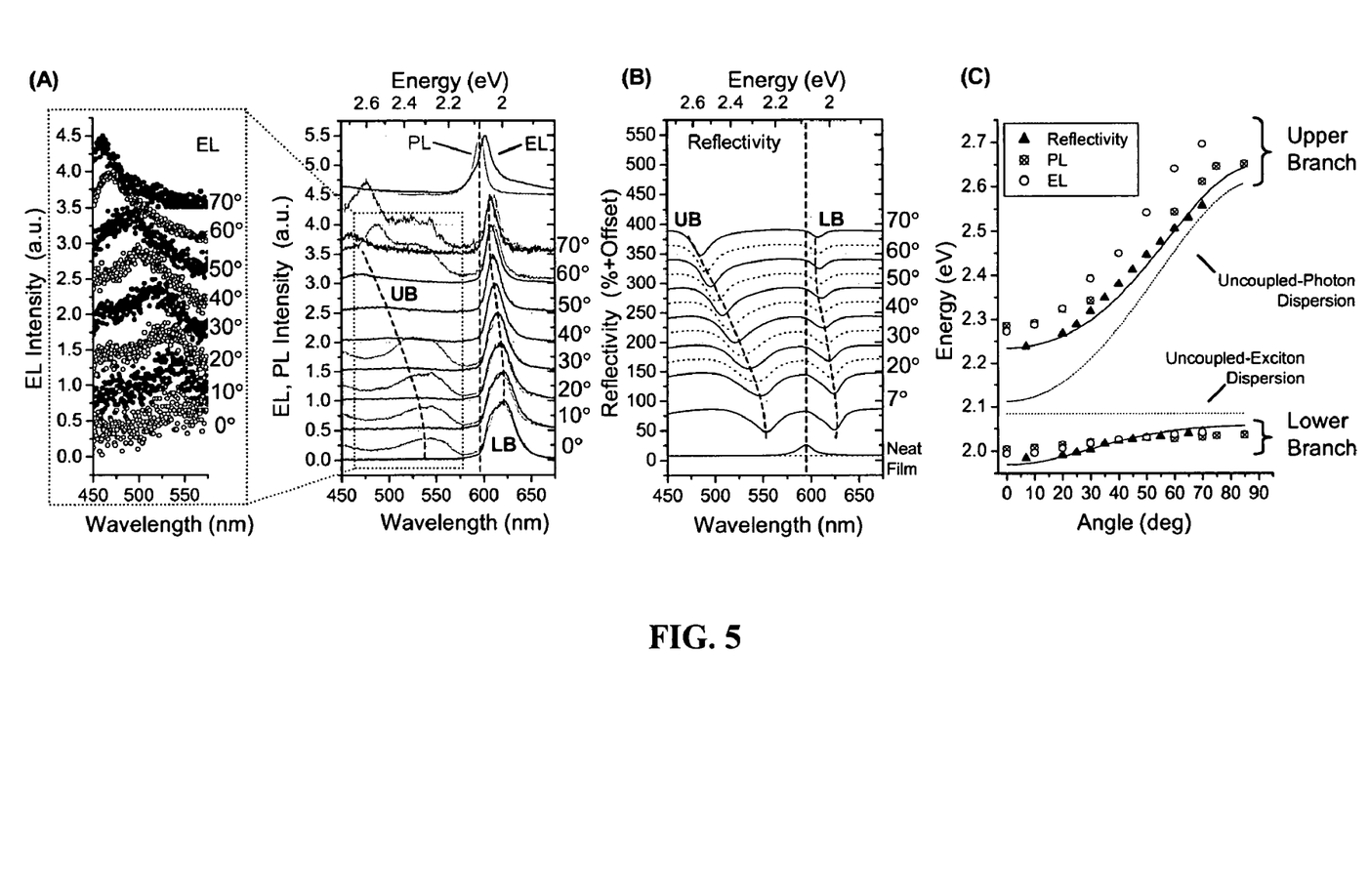
FIGS. 5A-5C are graphs depicting angularly resolved polariton electroluminescence, photoluminescence, and reflectance measurements for a polariton RC-OLED.

The characteristic dispersion of strong light-matter coupling was also observed in the angular EL spectra of the RC-OLEDs, since changing θ affected the tuning of $E_{ph}$ relative to $E_{ex}$. As θ increased, $E_{ph}$ tuned towards higher energy according to the dispersion relation[14]:

$$E_{ph}(\theta) = c\hbar|\vec{k}| = c\hbar|\vec{k}_\perp|(1-\sin^2\theta/n^2)^{-1/2}, \quad \text{(Eq. 2)}$$

while $E_{ex}$ remained constant (see, for example, Skolnick, M. S., et al. *Semiconductor Science and Technology* 13, 645-669 (1998), which is incorporated by reference in its entirety). In particular, for the RC-OLED of FIG. 5, where near-resonant tuning between cavity and exciton occurred at θ=0°, $E_{ph}$ (θ=0°)=2.11 eV compared to $E_{ex}$=2.08 eV, while $E_{ph}$ (θ=80°)=2.59 eV (with n~1.7 for poly-TPD and BCP). FIGS. 5A and 5B plot the angular EL, PL, and reflectance spectra for the RC-OLED.

FIG. 5A shows electroluminescence and photoluminescence overlay. Spectra were normalized relative to the lower energy peak. Signal intensity was approximately Lambertian in θ, requiring higher currents and spectrometric integration times to capture EL spectra at the larger angles. PL measurements taken at θ=40° and θ=50° were not plotted because the laser excitation, incident at θ=45°, saturated the CCD at these angles. The inset shows an expanded view of the high-energy portion of the angularly resolved EL spectra. The spectra were normalized to the peak data point in the λ=450 nm to λ=575 nm range. FIG. 5B shows reflectivity measurements that were taken through the substrate side of the samples with the incident light TE polarized, using a CARY-500i, with the surface reflectivity accessory (SRA) to measure the reflection at θ=7°, and the variable angle surface reflectivity accessory (VASRA) for wider angles. The reflectivity data of successive angular measurements was offset by 50 percentage points for each 10° increment of angle. The reflectivity of a 5±2 nm thick film of 4 bi-layers of PDAC/TDBC was also shown for comparison. The thin film has a single resonance at λ=595 nm compared to the exciton-polariton resonances at λ=554 nm and λ=625 nm of the polariton RC-OLED structures. FIG. 5C shows the polariton angular dispersion relation. The fit was generated from the reflectivity data using a two-state model of Eq. 1, with the coupling interaction being independent of angle and the cavity energy following Eq. 2.

As a result of the angular dependence, the polariton energy levels of Eq. 1 also became functions of θ with $E_\pm \to E_\pm(\theta)$. FIG. 5C captured the angular dependence of the emission peaks and reflectivity dips and the corresponding dispersion relations for $E_{ph}(\theta)$ and the polariton states $E_\pm(\theta)$. At θ=0°, near resonance for $E_{ph}(\theta)$ and $E_{ex}$, the polariton branches of the dispersion relation $E_\pm(\theta)$ anti-crossed in energy, while at larger θ, far away from the resonance condition, the polariton branches devolved into uncoupled exciton and photon dispersion curves.

In generating the polariton dispersion relation $E_\pm(\theta)$, the angular spectral data was fit with the same parameter for the vacuum Rabi-splitting $\hbar\Omega_i$=265 meV that was used to fit the θ=0° direction spectra of FIG. 4. The agreement of the angular (FIG. 5C) and normal (FIG. 4c) direction data with the same parameter for the Rabi-splitting was further confirmation that the spectral features observed in EL, PL and reflectivity were due to tuning of $E_{ph}$ relative to $E_{ex}$ in the strong coupling limit of light-matter interactions, consistent with Eq. 1.

PL, EL, and reflectivity yield similar dispersion relations as they all probed the same linear optical properties of the polaritons. See, for example, Savona, V., et al. *Solid State Communications* 93, 733-739 (1995); and Lidzey, D. G. et al. *Physical Review B* 65, art. no.-195312 (2002), each of which is incorporated by reference in its entirety. The similarity in dispersion also confirmed that electrical excitation, at this level of applied field (~$10^6$ V cm$^{-1}$) and current density (~0.1 A cm$^{-2}$), did not change the optical energy levels of the polariton states. The applied field did not perturb the Rabi-splitting, possibly because the dipoles contributing most to strong coupling lay in plane perpendicular to the direction of the applied E-field.

Although the dispersion relations of PL and EL coincided, the most striking differences were the attenuated intensity of the $E_\pm$ (upper) polariton branch in EL spectra, and the increased linewidth of EL emission from the polariton lower branch, with a distinct shoulder, peaked at λ=610 nm, superimposed on the polariton spectrum.

The EL shoulder was due to the luminescence of uncoupled J-aggregate excitons, which were not excited in PL. The optical excitation selectively delivered energy to the J-aggregates with dipoles in the plane of the substrate, parallel to the mirrors, which were the molecules that participate most strongly in the light-matter coupling. The EL excitation, however, did not select for the molecular orientation, exciting all the molecules of the somewhat disordered films.

The stronger upper branch emission in PL was due to optical filtering of the tail of the poly-TPD emission by the microcavity-like resonance of the polariton state. In the PL experiment the RC-OLED was pumped with λ=408 nm laser line creating excitons throughout the poly-TPD layer in addition to excitons that were optically generated on the J-aggregate bi-layers. The poly-TPD excitons within the Förster radius, $R_F$=3.6 nm, of the TDBC J-aggregates energy transferred non-radiatively to the J-aggregate layer, and populated the polariton states according to Boltzmann statistics. However, a large fraction of poly-TPD excitons (>93% for the 54 nm thick poly-TPD layer) were created beyond the Förster radius and radiatively recombined on poly-TPD. The resultant PL was either trivially absorbed by the J-aggregate or instead was optically filtered by the microcavity-like resonance of the polariton state, enhancing the spectral intensity of the upper branch.

In EL, excitons were created in a narrow (few nm) electron and hole recombination region located at the poly-TPD/TDBC interface. Therefore, the overwhelming majority of generated excitons were either formed on, or energy transferred to, the TDBC layer. This resulted in a Boltzmann distributed polariton emission, which favored the lower energy polariton branch.

Electrical excitation represented an entirely new way to access polariton physics, as it preserved the linear optical properties of polaritons, which have previously been examined only by reflectivity and PL measurements. The high oscillator strength and large binding energy of J-aggregate excitons (compared to those in inorganic semiconductors) resulted in the large Rabi-splitting of $\hbar\Omega_i$=265 meV and allowed for room temperature measurement of exciton polariton properties. The polyelectrolyte/J-aggregate bi-layer deposition technique enabled the concentration of the optically active J-aggregate film precisely at the anti-node of the microcavity, and opened up the possibility of engineering the energy levels and exciton dynamics of polariton heterostructures by incorporating other dyes within the Förster radius of the J-aggregate. The described physical processes governing operation of polariton RC-OLEDs, namely direct charge injection, non-radiative energy transfer, and radiative emission from host materials co-located in the microcavity, can give insight into how to design a polariton laser or other polariton devices where engineering the occupancy of a particular polariton state is critical for the device operation.

A photoluminescence excitation (PLE) experiment was performed to verify that non-radiative Förster energy-transfer was occurring in the polariton RC-OLED structures between the thin film of poly-TPD (42-65 nm) and the 4 bi-layers of PDAC/TDBC.

The test sample was a glass substrate dip-coated with 4 bi-layers of PDAC/TDBC and then a thin film of poly-TPD (55 nm) spin coated on top. Two control samples were used, one consisting of glass coated with just the bi-layers, and another with just the poly-TPD.

Figure 6:
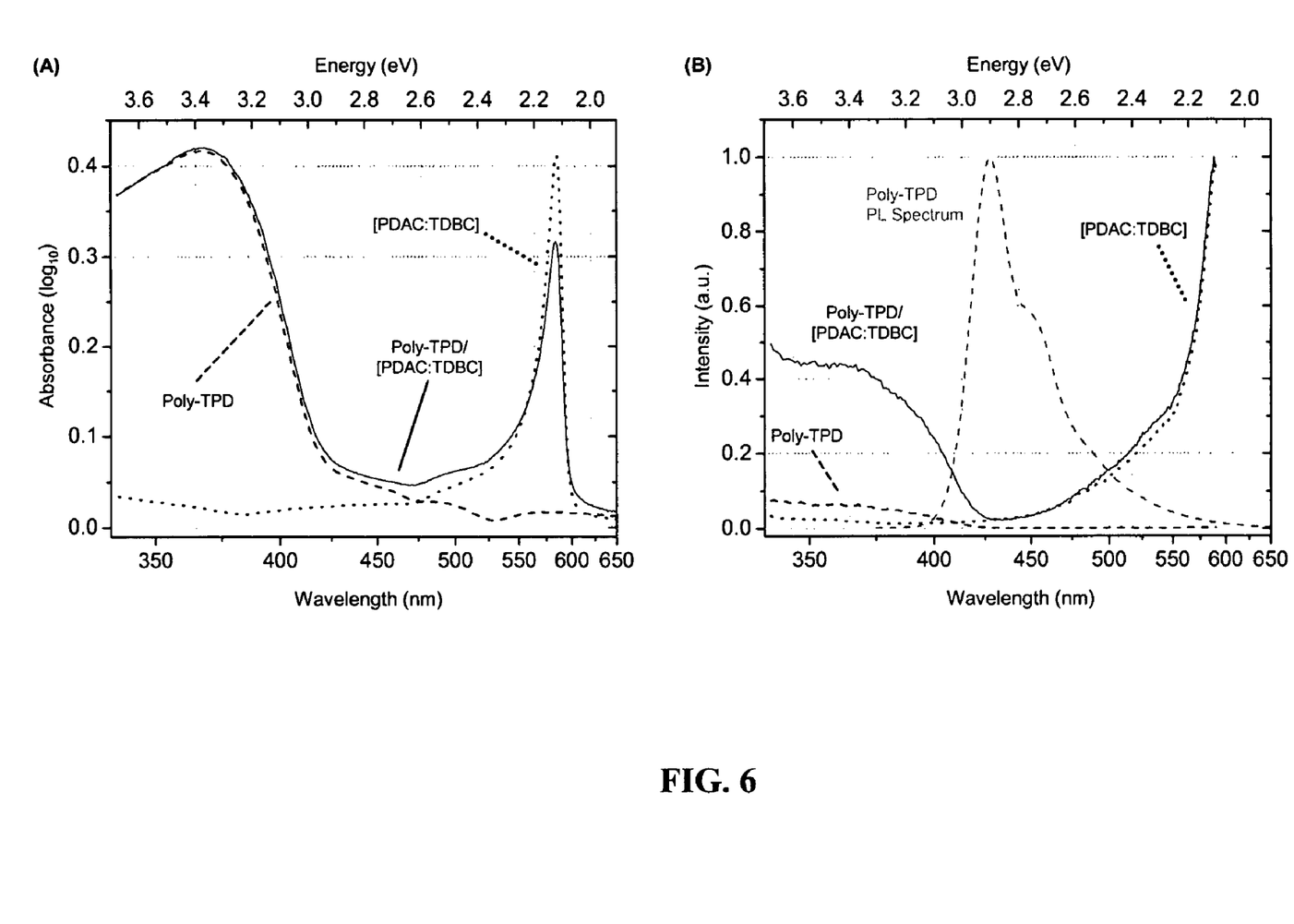
FIGS. 6A-6B are graphs depicting absorbance and photoluminescence excitation (PLE) spectra of thin-film samples.

FIG. 6 shows the absorbance spectra of the three films. The absorbance for wavelengths $\lambda<400$ nm was equivalent for the composite film and neat poly-TPD film, showing that in this region the J-aggregate absorption was minimal, and only the poly-TPD layer is absorbing light.

FIG. 6B shows results of the PLE measurement, in which the detector was fixed at $\lambda=600$ nm and the excitation was scanned from $\lambda=340$ nm to 590 nm. The samples were excited through the film side. The scan for the composite film showed that for excitation $\lambda=400$ nm, the emission at $\lambda=600$ nm was enhanced by a factor of 15.6, compared to exciting the neat PDAC/TDBC film at $\lambda=400$ nm. Furthermore, the data showed that exciting the composite film with $\lambda=400$ nm produced the same level of luminescence intensity as exciting the neat PDAC/TDBC film with $\lambda=523$ nm.

This emission enhancement was due to non-radiative Förster energy-transfer occurring between the thin film of poly-TPD and the 4 bi-layers of PDAC/TDBC. If it were simply the result of radiative energy-transfer, with the $\lambda=400$ nm excitation causing poly-TPD to emit light, and the TDBC layers reabsorbing all of it, 74% less intensity at $\lambda=600$ would have been observed than in the composite film case. The reason for the discrepancy was that in the process of radiative energy-transfer the photons emitted by the poly-TPD would be distributed with a probability distribution given by the poly-TPD PL spectrum, and as such most of the photons would be emitted within the wavelength interval where the PDAC/TDBC does not absorb strongly (precluding efficient reabsorption). If the PL spectra of poly-TPD were hypothetically concentrated at $\lambda=523$ nm, the emission at $\lambda=600$ would be identical for both the composite and neat PDAC/TDBC films. But because the PL was distributed, the equivalence between exciting at $\lambda=400$ nm and $\lambda=523$ nm must be due to non-radiative Förster energy-transfer. This calculation was supported by PL spectral data of the three films, excited at $\lambda=400$ nm, where the intensity of the J-aggregate peak for the composite film case was a factor of 6 larger than in the case of the neat film.

The Förster transfer radius from a poly-TPD molecule to a single TDBC J-aggregate was calculated to be 3.6 nm.

Methods

The polariton RC-OLED included the high oscillator strength optical transition of the J-aggregate layer, which had narrow optical reflection (FWHM=19 nm) and PL spectra (FWHM=13 nm) and minimal Stokes shift ($\Delta\lambda<5$ nm). See, for example, Jelley, E. E. *Nature* 138, 1009-1010 (1936); and Mobius, D. Scheibe Aggregates. *Advanced Materials* 7, 437-444 (1995); each of which is incorporated by reference in its entirety. In the J-aggregate, the monomers physically aggregated through electrostatic and electrodynamic interactions, so that the dipole moments aligned and coupled to act as a single harmonic oscillator deriving oscillator strength from all the aggregated monomers. See, for example, Tuszynski, J. A., et al. *Physical Review E* 59, 4374-4383 (1999); and Vanburgel, M., et al. *Journal of Chemical Physics* 102, 20-33 (1995); each of which is incorporated by reference in its entirety.

The strategy used to drive physical aggregation in thin film and thus form the J-aggregate layer was to adsorb dye monomer (TDBC) on the surface of a polyelectrolyte (PDAC) monolayer through Coulomb attraction. Fukumoto et al. developed the bi-layer approach based on Decher's technique of building polyelectrolyte multi-layers by dip-coating oppositely charged polyelectrolyte monolayers, one at a time. See Fukumoto, H. et al. *Thin Solid Films* 329, 748-751 (1998); and Decher, G., et al. *Thin Solid Films* 210, 831-835 (1992); each of which is incorporated by reference in its entirety. Similar to polyelectrolyte-only systems, assembling polyelectrolyte/J-aggregate bi-layers included adsorbing onto the substrate a monolayer of polycation, a process that was self-limited by electrostatic repulsion. Adsorption of the polycation was followed by a layer of J-aggregated negatively charged cyanine dye salt molecules.

In particular, to assemble a single bi-layer of PDAC/TDBC, the following sequence was used. First the substrate was dipped into 20% (w/v) PDAC solution in deionized water for 15 minutes, and then dipped through three deionized water rinses (2 minutes, 2 minutes, and 1 minute) to remove all but the first layer of PDAC. Next, the substrate was dipped into the TDBC solution ($5\times10^{-5}$ M, pH 9.0, 15 min.), and then passed through three rinses (pH 9.0, same step times) to remove excess dye. NaOH was carefully added to adjust the pH of the dye solutions, since pH directly affects degree of aggregation, oscillator strength, and PL quantum efficiency. A single bi-layer was ~1.7 nm thick. The dye was at a high enough concentration to J-aggregate in solution, and so J-aggregate crystallites were adsorbed directly onto the polycation layer. Follow-on experiments showed that even at concentrations where the dye solution remains monomeric, J-aggregate thin films formed, due to the electrostatic attraction between the charged dye monomers and polycations.

To assemble PDAC/TDBC multilayers, the growth sequence was repeated. The assembly was started by dipping the substrate into the polycationic PDAC solution because the substrates, (oxygen plasma cleaned glass or poly-TPD films) initially carried negative charge.

For developing polariton RC-OLEDs, the dip-coating technique was used for its inherently advantageous properties. Large numbers of bi-layers can easily be stacked (Fukumoto, H. et al. *Thin Solid Films* 329, 748-751 (1998), which is incorporated by reference in its entirety) to form a very high absorbance and reflectance film that can be positioned at the anti-node of a microcavity to produce easily tuneable giant Rabi-splitting (in excess of $\hbar\Omega_r=265\pm15$ meV). Bi-layers of J-aggregate were formed on a variety of substrates, such as glass and polymers, and they were potentially more planar oriented and crystalline than J-aggregates produced in spin-cast polymer matrices, translating into larger domains of exciton-coherence in polariton devices than were otherwise achievable. See, for example, Agranovich, V. M., et al. *Physical Review B* 67, art. no.-085311 (2003), which is incorporated by reference in its entirety. The technique worked for a variety of dyes, allowing the formation of J-bands throughout the visible spectrum (depending on the application) or to combine bi-layers of different dyes to engineer the energy levels and oscillator strength of specific polariton devices.

TDBC was chosen as the J-aggregating cyanine dye because it fluoresces efficiently even as a monomer, forms J-aggregates at ultra low concentrations (<$10^{-5}$ M in water) and has been well-studied as a silver-halide sensitizer, membrane-potential sensitive dye, and for its rich exciton dynamics. See, for example, Vanburgel, M., et al. *Journal of Chemical Physics* 102, 20-33 (1995); and Reers, M., et al. *Biochemistry* 30, 4480-4486 (1991), each of which is incorporated by reference in its entirety. TDBC has two negative charge sites, (disulfopropyl groups) which made it electrostatically compatible for dip-coating with PDAC. See, for example, Bourbon, S., et al. *Synthetic Metals* 101, 152-153 (1999), which is incorporated by reference in its entirety.

Integrating a water-based dip-coating technique into the device deposition can require careful management of material compatibilities. To prevent delamination of the poly-TPD layer during dip-coating, the poly-TPD coated substrate was heated to 100° C. for 45 minutes, causing the film to crosslink. After dip-coating, the substrates were dried with nitrogen, and placed under high vacuum ($1\times10^{-7}$ Torr) to remove water, before the ETL and cathode layers were thermally evaporated.

Other embodiments are within the scope of the following claims.

What is claimed is:

1. An electrically driven light emitting device comprising:
   an optical cavity having a resonant mode;
   a cathode;
   an anode, wherein the cathode and anode are connected to a power source and is arranged to apply an electric field to the optical cavity; and
   a region including a multiply charged material disposed between the cathode and the anode, wherein the region including the multiply charged material includes a material having an optical transition within the optical cavity, wherein the resonant mode and the optical transition are energy matched and strongly coupled and wherein the region includes an electrostatic bilayer, the bilayer including the multiply charged material having an optical transition, wherein the multiply charged material includes a polyelectrolyte.

2. The light emitting device of claim 1, wherein the material having an optical transition includes an inorganic semiconductor, an organic dye, a semiconductor nanocrystal, a J-aggregate, or a combination thereof.

3. The light emitting device of claim 1, wherein the polyelectrolyte is a polycation.

4. The light emitting device of claim 1, wherein the polyelectrolyte is a polyanion.

5. The light emitting device of claim 1, wherein the multiply charged material includes a metal ion.

6. The light emitting device of claim 1, wherein the optical cavity is defined by a pair of opposed reflective elements.

7. The light emitting device of claim 6, wherein the reflective elements include a metal.

8. The light emitting device of claim 6, wherein the reflective elements include a dielectric mirror.

9. The light emitting device of claim 1, wherein the material having an optical transition is located substantially at an anti-node of the optical cavity.

* * * * *

UNITED STATES PATENT AND TRADEMARK OFFICE
CERTIFICATE OF CORRECTION

PATENT NO. : 7,649,196 B2
APPLICATION NO. : 11/265199
DATED : January 19, 2010
INVENTOR(S) : Tischler et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 727 days.

Signed and Sealed this

Twenty-third Day of November, 2010

David J. Kappos
*Director of the United States Patent and Trademark Office*